United States Patent
Aoyama et al.

(10) Patent No.: US 7,643,904 B2
(45) Date of Patent: Jan. 5, 2010

(54) RANDOM-PERIOD CHIP TRANSFER METHOD

(75) Inventors: Hiroshi Aoyama, Akashi (JP); Ryoichi Nishigawa, Hyogo (JP)

(73) Assignee: Hallys Corporation, Akashi-shi (JP)

( * ) Notice: Subject to any disclaimer, the term of this patent is extended or adjusted under 35 U.S.C. 154(b) by 1 day.

(21) Appl. No.: 11/849,806

(22) Filed: Sep. 4, 2007

(65) Prior Publication Data

US 2008/0005895 A1 Jan. 10, 2008

Related U.S. Application Data

(62) Division of application No. 10/677,180, filed on Oct. 2, 2003, now Pat. No. 7,278,203.

(30) Foreign Application Priority Data

Feb. 7, 2003 (JP) .............................. 2003-031165

(51) Int. Cl.
   B65G 17/00 (2006.01)
   B65G 29/02 (2006.01)
   B65G 23/00 (2006.01)
   B65G 47/90 (2006.01)

(52) U.S. Cl. ...................... 700/248; 700/245; 198/792; 198/377.01; 198/377.02; 198/793

(58) Field of Classification Search .............. 414/749.3, 414/749.5, 222.01, 222.09, 222.12, 225.01, 414/331.02, 418, 757, 773, 813, 806; 700/245, 700/253, 248; 29/740, 739, 428, 825, 721, 29/720, 743; 198/341.09, 347.1, 358, 349.2, 198/349.3, 369.2, 369.5, 377.04, 377.08, 198/461.1, 341.01, 345.2, 347.3, 377.01, 198/377.03, 415, 759, 792, 377.02, 793

See application file for complete search history.

(56) References Cited

U.S. PATENT DOCUMENTS

| 4,506,779 | A | * | 3/1985 | Seragnoli | 198/459.1 |
| 4,548,668 | A | * | 10/1985 | Roth et al. | 156/357 |
| 4,880,102 | A | * | 11/1989 | Indrebo | 198/418.3 |
| 5,311,763 | A | * | 5/1994 | Gibbs et al. | 73/9 |
| 6,722,494 | B2 | * | 4/2004 | Nakakado | 198/792 |
| 7,032,303 | B2 | * | 4/2006 | Kawada | 29/832 |
| 2002/0081180 | A1 | * | 6/2002 | Berndtsson | 414/333 |

* cited by examiner

Primary Examiner—Thomas G Black
Assistant Examiner—Christine M Behncke
(74) Attorney, Agent, or Firm—Westerman, Hattori, Daniels & Adrian, LLP (57) ABSTRACT

A chip transfer apparatus includes a first carrier for feeding chips and a second carrier for carrying works on it. The transfer apparatus also includes a transfer engine including two or more coaxial revolvers, which can revolve coaxially with each other. Each of the coaxial revolvers includes an end-effector for receiving a chip from the first carrier and transferring the received chip onto a work on the second carrier. The end-effectors of the coaxial revolvers are arranged in a circle coaxial with the revolvers. The end-effectors sequentially receive chips from the first carrier at substantially zero speed relative to the first carrier and transfer the received chips onto works on the second carrier at substantially zero speed relative to the second carrier. While the end-effectors are revolving, they undergo periodic speed change control for timing adjustment and speed adjustment for the chip reception and transfer.

4 Claims, 8 Drawing Sheets

RANDOM-PERIOD CHIP TRANSFER METHOD

CROSS-REFERENCES TO RELATED APPLICATIONS

This is a divisional of U.S. patent application Ser. No. 10/677,180, filed with the United States Patent Office on Oct. 2, 2003, subsequently published Aug. 24, 2004, as US Pregrant Patent Application Publication No. 2004/0154161 A1, and claims the benefit of priority of Japanese Patent Application No. 2003-31165, filed with the Japan Patent Office on Feb. 2, 2003, subsequently registered Jan. 25, 2006, as Japanese Patent No. 3,739,752 B2.

BACKGROUND OF THE INVENTION

1. Field of the Invention

The present invention relates to a transfer apparatus for transferring parts onto works with revolving end-effectors.

2. Description of the Related Art

Conventionally, there has been such an electronic parts mounting apparatus available in the field of semiconductor production for receiving chips, transferring the received chips onto works and arranging, sticking or electrically connecting the transferred chips on the works (e.g., Japanese Laid-Open Patent Publication No. H10-145091). This apparatus is a rotary type mounting apparatus having multiple transfer heads, which revolve to mount chips on works in sequence. The transfer heads are arranged coaxially around a main shaft and revolve in a circular orbit around the shaft. Operation stages are set at fixed positions on the orbit such as a suction stage where the transfer head sucks a chip from a chip feeder, and a mounting stage where the transfer head mounts the sucked chip on the work. The transfer heads stop at each of the operation stages to transfer chips. In order to keep the main shaft rotating while the transfer heads are stopping, the mounting apparatus is equipped with a fixed earn having a curve to substantially stop the transfer heads by canceling the rotational speed transmitted from the main shaft to the heads. Thus an apparatus is realized which can mount chips while its main shaft is continuously rotating.

However such apparatus for mounting electronic parts mentioned above transfers chips by means of transfer heads, the periodic motion is rigid because the motion is generated by mechanical cams. Accordingly, the transfer heads are constrained to move in conjunction with the rotation of the main shaft.

Recently, commodity control by means of disposable type RFID (radio frequency identification) tags is made in several field as a result of advancement of information technology and requirement of the laborsaving for information management. This requires mass production of cheap RFID tags (RF tags or radio tags). The mass production of RF tags may also require following processes or process technologies; feeding electronic parts for RF transmission/reception continuously at a constant pitch without halting them; receiving the fed parts without halting them; transferring the received parts without halting them onto sheet-type works having an antenna element formed on it while the works are moving continuously and are fed side by side in a constant pitch; arranging, sticking, or electrically connecting the parts onto the work. If the periodic motion of the transfer heads is rigidly fixed, following problems may occur for the mass production mentioned above. That is, it is necessary to replace the cam troublesomely for every products of a different size or pitch. Besides, because the motion of the transfer heads is limited, the heads cannot follow an irregular change of the pitch of fed parts or an irregular change of the pitch of moving works. Those transfer heads cannot respond to random pitch changes or real-time fine adjustment, and consequently, accurate parts positioning is impossible.

Another conventional transfer mechanism is known, which includes a single transfer head and has an electronic cam driven by a single motor with which period can be changed. However, the single transfer head is not adaptable for high-speed mass production even though it may ensure positioning accuracy.

SUMMARY OF THE INVENTION

Accordingly, the object of the present invention is to provide a random-period chip transfer apparatus that can realize accurate positioning and high-speed transfer, and that can also respond to changes of the speeds and pitches at which chips and works are fed.

In order to attain the above object, according to the present invention, a chip transfer apparatus for transferring chips onto works, comprises a first carrier for carrying chips thereon; a second carrier for carrying works thereon; a plurality of end-effectors receiving chips from the first carrier and transferring the chips onto the works carried by the second carrier; a plurality of coaxial revolvers, each of which has one end-effector, and can revolve around one common axis independently; and servo drives, each of which drives each of coaxial revolvers to independently and randomly change periodic revolving speed of each coaxial revolver; wherein each of the end-effectors is inseparably mounted on each of the coaxial revolvers and distributed in one common circle around the axis, wherein each of the end-effectors moves sequentially keeping their order by the action of said servo drives, and is synchronized with the first carrier movement to receive a chip from the first carrier at substantially zero speed relative to said first carrier and is synchronized with the second carrier movement to transfer the received chip onto the work on the second carrier at substantially zero speed relative to the second carrier, and is independently changed its revolving speed during the periodic motion including said receiving and transferring motion.

The end-effectors of the coaxial revolvers are arranged in a circle coaxial with the revolvers axis, and are revolved independently in sequence, and sequentially receive chips from the first carrier at substantially zero speed relative to the carrier by synchronizing the end-effector with the carrier, and transfer the received chips onto the works on the second carrier at substantially zero speed relative to the carrier by synchronizing the end-effector with the carrier while they are revolving with each own periodic speed changed and controlled independently. This can realize high positioning accuracy and high-speed transfer in response to chances of the speeds and pitches at which chips and works are fed. For example, if the end-effectors are six in number, they can receive chips fed at a speed that is nearly six times the revolving speed. Chips can be fed at a constant pitch sequentially without halting. The end-effectors can receive the fed chips without halting them and transfer the received chips onto works moving at a constant pitch sequentially without halting.

It is possible to transfer chips accurately to predetermined positions on works by accelerating or decelerating the end-effectors in response to pitch variations of works on the second carrier. Thus, the independent control of the revolution of each end-effector enables free pitch changes and real-time fine adjustments of chips and works, which enable high-speed and accurate transfer. By independently correcting the position of each end-effector, it is possible to achieve tens of microns and some microns in accuracy, thereby improving the productivity and the mounting quality.

Preferably, in the transfer apparatus, each of the coaxial revolvers includes a coaxial bearing arranged in order on the axial direction having an inner race fixed to an outer race of the coaxially adjacent bearing, and having an outer race fixed to am inner race of the coaxially adjacent another bearing; the inner race of the bearing on one end side being fixed to an outer race of an additional bearing which inner race is fixed to one fixed side and the outer race of the bearing on the other end side being fixed to the other fixed side; each of the end-effectors being inseparably fixed to the inner race of the associated bearing, and the outer race of the associated bearing being activated by a rotational driving force of each of the servo drives. In this case, the coaxial revolvers support each other. If the coaxial revolvers are three in number, they can be driven by three general-purpose servo control system motors positioned at different angles around the axis. This makes it possible to average and distribute the external forces exerted on the bearing axis. Because the coaxial revolvers can revolve independently of each other, the drive wheels made up on each outer race of the associated bearing can be connected to general-purpose servo control system motors so that their revolving speed/phase change control and position correction control can be done. Since a space surrounding each of the outer races of the bearings is wide enough, it is possible to house more accurate direct drive/control in place of the general-purpose servo control system.

Preferably, in the transfer apparatus, each of the coaxial revolvers is individually and independently made its periodic speed change and phase control by the operation of the associated servo drive. In this case, independent control of the revolution of each end-effector enables free pitch changes and real-time fine position adjustment of chips and works. This enables high-speed and accurate transfer.

Preferably, the transfer apparatus further comprising a measuring unit for measuring the speed of the chips carried on the first carrier and/or the speed of the works carried on the second carrier, the servo drives being operated on the basis of the measurement result of the measuring unit In this case, without using indirect information based on the first carrier and/or the second carrier motion control information, it is possible to use directly obtained speed and/or position data of chips and/or works. Therefore accurate and real-time control of the coaxial revolvers revolution is possible. This enables high-speed and accurate transfer.

Preferably, in the transfer apparatus, even if the first and second carriers move at different speeds, each of the end-effectors receives a chip from the first carrier at substantially zero speed relative to the first carrier synchronized with the first carrier movement, and transfers the received chip onto a predetermined position of the work on the second carrier at substantially zero speed relative to the second carrier synchronized with the second carrier movement. This enables high-speed and accurate transfer even in a case where the feeding speed of chips, which depends on the moving speed of the first carrier, is lower than the moving speed of works, which depends on the moving speed of the second carrier. This case may be a case where the end-effectors transfer chips onto works that are larger in size than the chips.

Preferably, in the transfer apparatus, each of the first and second carriers is a rotating cylinder or a conveyor belt. In this case, the end-effectors can receive chips by approaching the chips carried on a rotating cylinder or a running conveyor belt and transfer the received chips onto works by approaching the works carried on a rotating cylinder or a running conveyor belt.

Preferably, in the transfer apparatus, the chips are electronic parts, and the works are IC card parts or RF tag parts in the form of sheets. In this case, it is possible to improve the productivity and quality of IC cards or RF tags by means of the foregoing operation and effect/s of the transfer apparatus.

DETAILED DESCRIPTION OF THE PREFERRED EMBODIMENT

Figure 1:
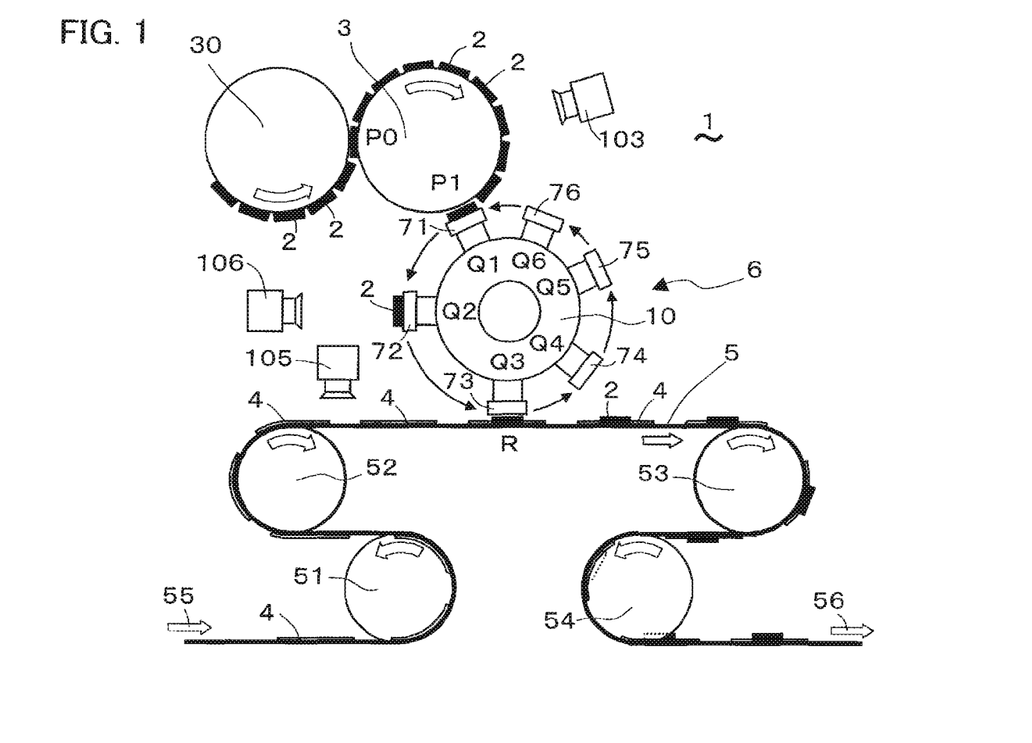
FIG. 1 is a conceptual view of a chip transfer apparatus embodying the present invention.

FIG. 1 shows a chip transfer apparatus 1 embodying the present invention. The transfer apparatus 1 includes a first carrier 3, a second carrier 5 and two transfer engines 6. The first carrier 3 carries chips 2 on it and feeds the carried chips. The second carrier 5 carries works 4, onto which chips 2 can be transferred. Each transfer engine 6 includes three coaxial revolvers 10. The coaxial revolvers 10 of the two transfer engines 6 revolve coaxially with each other around a horizontal axis CL (FIG. 6B). Each coaxial revolver 10 of one of the engines 6 is fitted with an end-effector 71, 73 or 75. Each coaxial revolver 10 of the other engine 6 is fitted with an end-effector 72, 74 or 76. Each of the end-effectors 71-76 receives a chip 2 from the first carrier 3 and transfers the received chip onto a work 4 on the second carrier 5.

The end-effectors 71-76 are arranged at intervals in a circle coaxial with the horizontal axis CL (FIG. 6B). While the end-effectors 71-76 are revolving around the horizontal axis CL, they receive chips 2 in order from the first carrier 3 at a nearly zero speed relative to this carrier synchronously with the rotation of this carrier. While the end-effectors 71-76 are revolving around the horizontal axis CL, they transfer in order the received chips 2 to predetermined positions on works 4 on the second carrier 5 at a nearly zero speed relative to this carrier synchronously with the movement of this carrier. During the revolution of each of the end-effectors 71-76, timing adjustment is independently carried out for the reception and transfer on the revolving orbit, and period change control is independently carried out for the speed adjustment at that time.

Six angular positions Q1-Q6 are predetermined around the horizontal axis CL (FIG. 6B). In FIG. 1, the end-effector 71 is in the angular position Q1, where it receives a chip 2 from the first carrier 3. In FIG. 1, the end-effector 72 is in the angular position Q2, where it is moving toward the second carrier 5. In FIG. 1, the end-effector 73 is in the angular position Q3, where it transfers a chip 2 onto a work 4. In FIG. 1, the other end-effectors 74, 75 and 76 are in the angular positions Q4, Q5 and Q6 respectively, nowhere they are moving toward the first carrier 3.

The first carrier 3 is a cylindrical or columnar rotor and adjoins a chip feeder 30. The first carrier 3 receives a chip 2 at a point P0 from the chip feeder 30 and transfers the received chip 2 at a point P1 to one of the coaxial revolvers 10. Normally, the first carrier 3 rotates at a constant speed and carries chips 2 at regular intervals on its cylindrical wall. The cylindrical wall may be formed with holes, through which air can be sucked to hold chips 2 on the wall. It is possible to release the held chips 2 by stopping the suction or applying positive pressure at a predetermined rotary position. As shown in FIG. 1, the chip feeder 30 takes the form of a roller, around which a tape may temporarily retain chips 2 on it until they are fed. Alternatively, a continuous material might be fed and cut into chips, which might then be fed to the chip feeder 30.

The second carrier 5 may include a belt, which can be moved by four rollers 51-54. The start end of the belt is fed from a roll (not shown), and the other end is taken up by another roll (not shown).

Each of the two carriers 3 and 5 is so adjusted by a drive (not shown) and a drive control system (not shown) as to operate at a constant speed. Before chips 2 are transferred onto works 4, the conditions of the chips 2 and works 4 are photographed by three measuring units 103, 106 and 105, which may be cameras. The image processing of the photographs makes it possible to detect irregular pitches, abnormal positions, foreign substances and other abnormalities. Before chips 2 are transferred onto works 4, the moving speeds of the chips 2 and works 4 are measured by the measuring units 103, 106 and 105 so that the revolution of the coaxial revolvers 10 can be controlled.

Figures 2A, 2B:
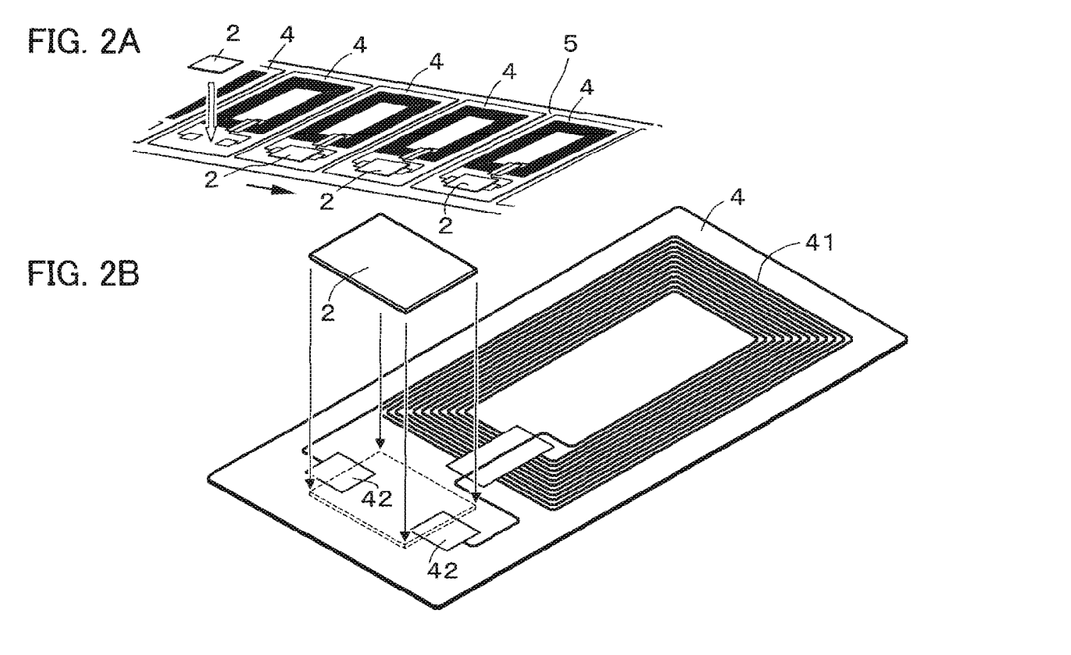
FIG. 2A is a perspective view of chips and works, showing how the transfer apparatus transfers the chips onto the works.
FIG. 2B is a perspective view of one of the chips and one of the works.

For the production of RF tags, as shown in FIGS. 2A and 2B, the transfer apparatus 1 transfer chips 2 that are electronic parts for RF reception and transmission onto works 4 each having an antenna 41. The works 4 may be carried on the second carrier 5 in the form of a belt. Alternatively, the works 4 may be printed, photographically formed or otherwise integrally formed on a flexible substrate in the form of a tape as the second carrier 5. Both terminals 42 of the antenna 41 on each work 4 may be coated in advance with conductive resin for electric connection. Each chip 2 is mounted between the antenna terminals 42 on one of the works 4. The RF tags are so small as to be called sesame chips. The RF tags need to be tens of microns or some microns in accuracy for the positioning accuracy of the chips 2. This can be realized by the transfer apparatus 1. For mass production of cheap RF tags, the chips 2 can be mounted as stated above while the works 4 are conveyed in series without halting. The transfer apparatus 1 can be used not only to produce RF tags, but also to transfer and mount electronic parts onto IC card parts etc.

Figure 3A:
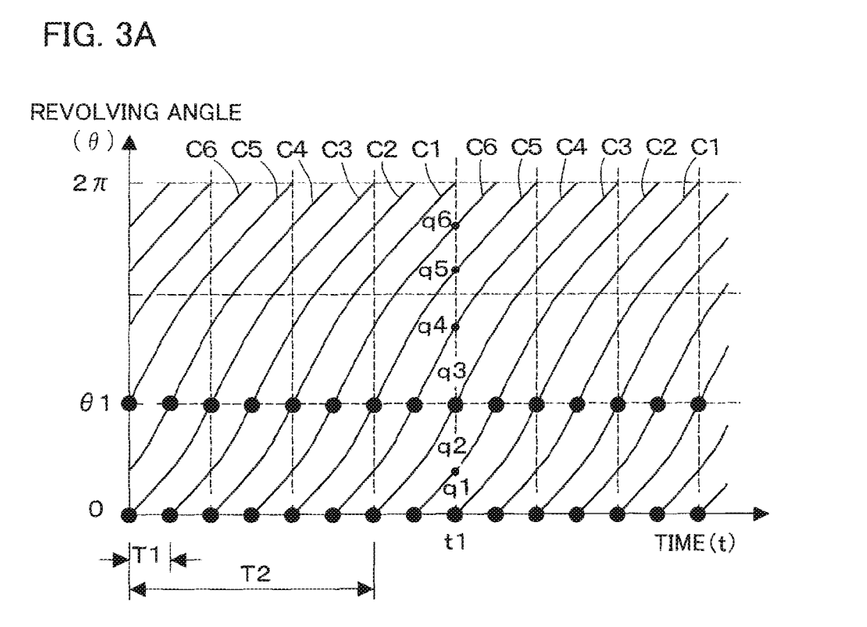
FIG. 3 is a graph of changes in revolving angle with time, showing the revolution of the end-effectors of the transfer apparatus.

The foregoing high-speed and accurate transfer can be realized by the revolution of the end-effectors. The end-effector revolution will be described below with reference to FIG. 3, which shows changes with time in the revolving angles of the end-effectors. The curves C1-C6 in FIG. 3 represent the movement of the end-effectors 71-76 respectively. The revolving angles q1-q6 of the end-effectors 71-76 at a time t1 correspond to the angular positions Q1-Q6 (FIG. 1) respectively. The angular position Q1 is on the plane where the axes of the first carrier 3 and coaxial revolvers 10 extend. The angular position Q1 is the starting point of the revolving angles θ. The end-effectors 71-76 revolve counterclockwise in FIG. 1. With reference to FIG. 3, the end-effectors 71-76 receive chips 2 from the first carrier 3 cyclically at a period (pitch) T1. The period T1 is determined by the rotational speed of the first carrier 3 and the intervals at which chips 2 are carried on this carrier. The end-effectors 71-76 receive chips 2, transfer the received chips and revolve cyclically at a period T2. The period T2 for a small number of cycles is about six times T1 (T2 nearly equal 6×T1). The average period T2 for a large number of cycles is six times T1 (T2=6×T1). The revolution of each of the six end-effectors is independently controlled so that chips can be fed and transferred at a speed that is about six times the revolving speed of the end-effectors.

Figure 4A:
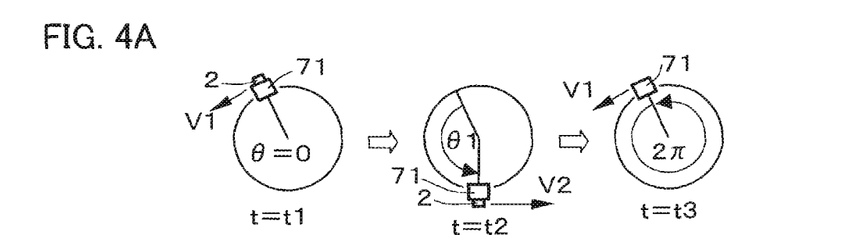
FIG. 4A is a schematic diagram of one of the end-effectors, showing how each of them revolves.
Figure 4B:
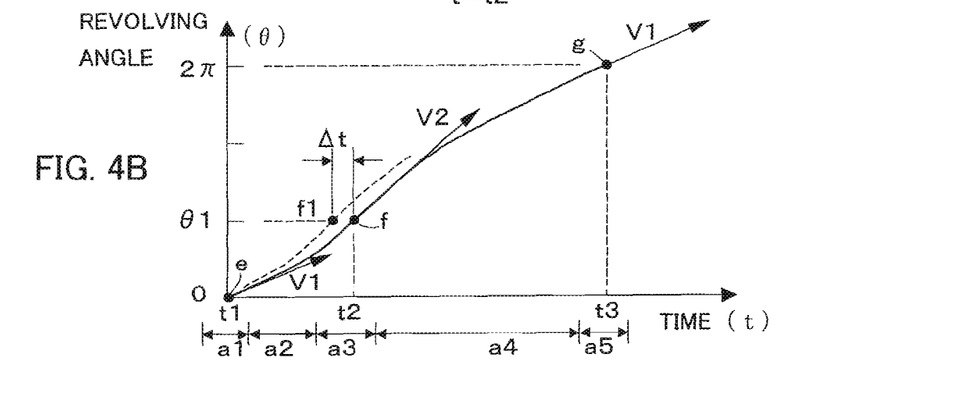
FIG. 4B is a graph of a change in revolving angle with time, showing the revolution shown in FIG. 4A.

The revolution of each end-effector will be described with reference to FIGS. 4A and 4B, which show the change with time in the revolving angle of the end-effector 71. The end-effector 71 receives a chip 2 at the angular position Q1, where its revolving angle is zero, at the time t1 while it is revolving at a speed V1. The end-effector 71 transfers the received chip 2 onto a work at the angular position Q3, where its revolving angle is θ1, at a time t2 while it is revolving at a speed V2. The end-effector 71 returns to the angular position Q1, where its revolving angle is 2π, at a time t3 (=t1+T2). In order to receive a chip 2 moving on the first carrier, the end-effector 71 revolves at a constant speed during a time period a1 or a5 so as to move at nearly zero speed relative to the chip synchronously with the moving speed of the chip. Likewise, in order to transfer a chip 2 onto a work moving on the second carrier, the end-effector 71 revolves at a constant speed during a time period a3 at nearly zero speed relative to the work synchronously with the moving speed of the work. The end-effector 71 accelerates and decelerates during time periods a2 and a4 respectively while it is revolving in the orbit.

Not only speed adjustment but also time adjustment are made during the time periods a2 and a4. For example, with reference to FIGS. 1 and 4B, the camera 105 may measure a pitch variation of works 4 on the second carrier 5, and the end-effector 71 may have to transfer the chip 2 on it onto one of the works a time *t earlier. In this case, the end-effector 71 can be so accelerated as to make the curve of FIG. 4B to pass through a point f1 in place of a point f. This makes it possible to transfer the chip 2 accurately to the predetermined position on the work 4. Thus, by independently controlling the revolution of each of the end-effectors 71-76, it is possible to transfer chips 2 onto works 4 accurately at high speed.

Figure 5:
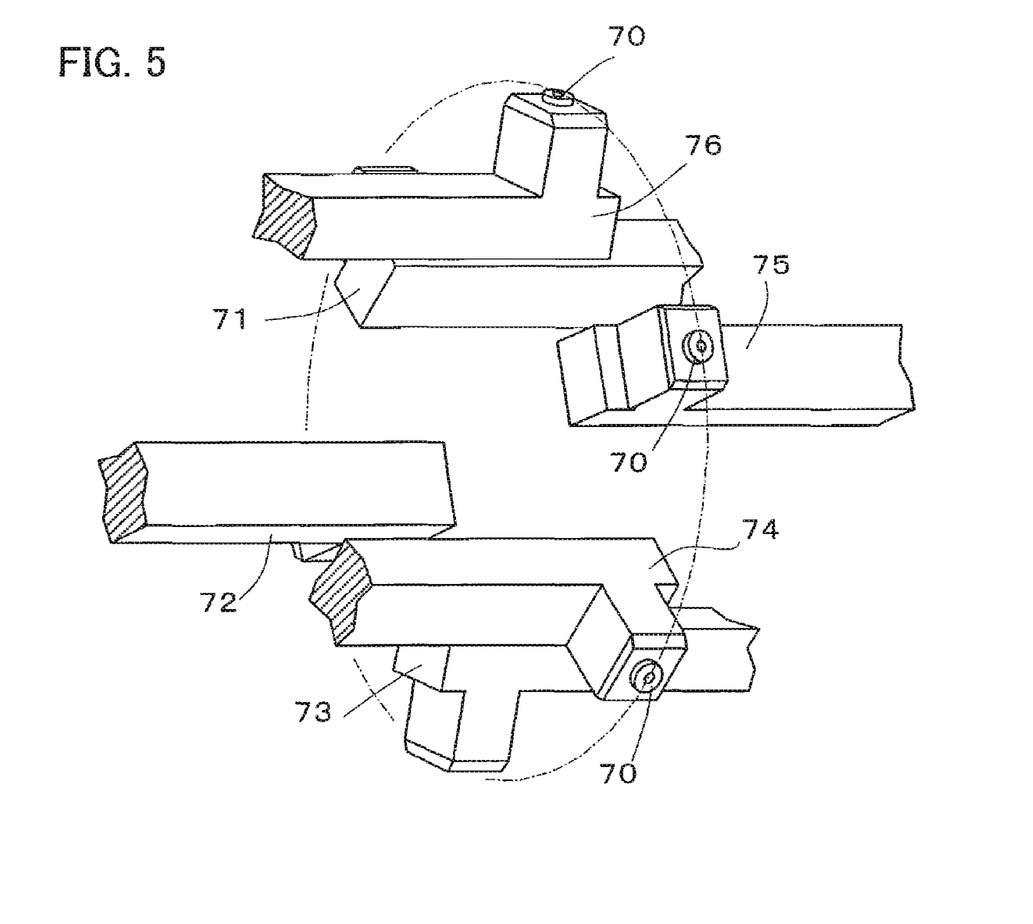
FIG. 5 is a partial perspective view of the end-effectors.

The structure of the coaxial revolvers 10 and transfer engines 6 will be described below with reference to FIGS. 5-10. Each of the end-effectors 71-76 is fitted with a suction pad 70 near its one end. The suction pad 70 has a hole formed through it for pneumatic control. The end-effector receives a chip by means of suction through the pad hole and transfers the received chip by making the pressure normal or positive. The suction pad 70 revolves together with the end-effector. As shown in FIG. 5, the three end-effectors 71, 73 and 75 make one set, and the other three end-effectors 72, 74 and 76 make another set. As shown in FIG. 1, the transfer engines 6 are positioned coaxially with and opposite each other. The three end-effectors of one of the sets are positioned alternately with those of the other set in the same circle around the horizontal axis CL.

Figure 6A:
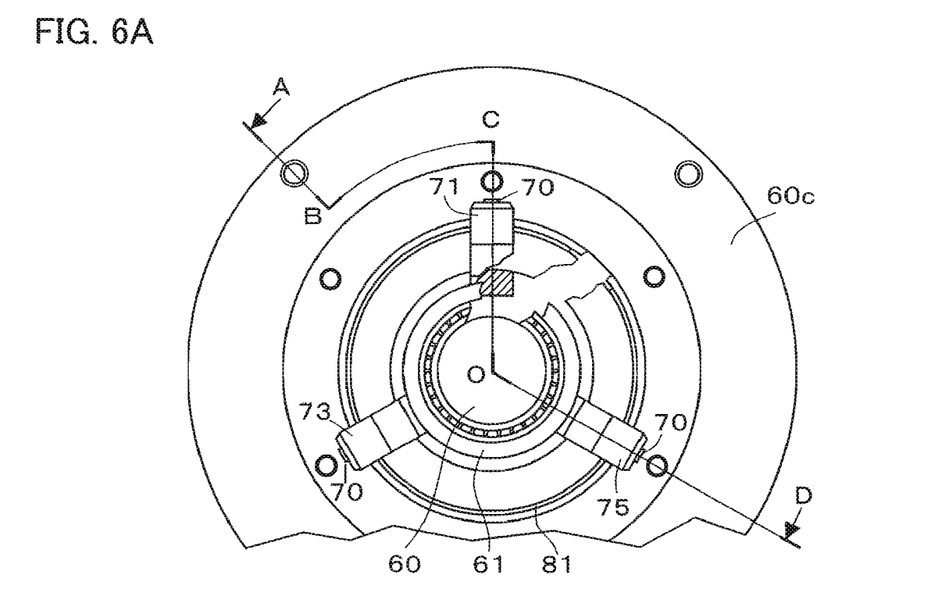
FIG. 6A is an end view of a transfer engine of the transfer apparatus.
Figure 6B:
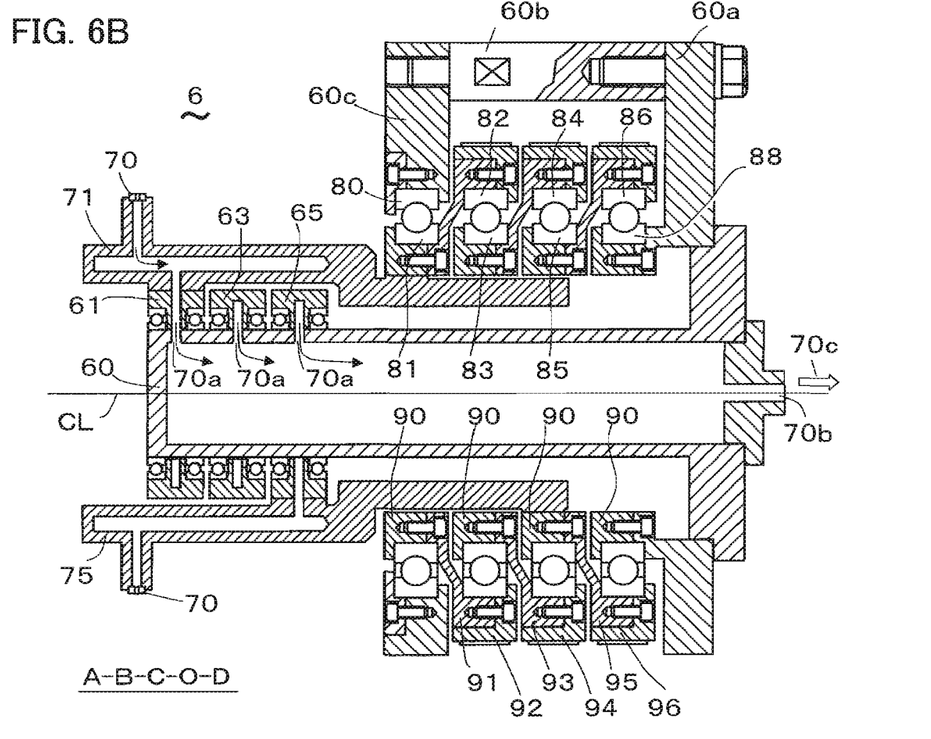
FIG. 6B is a cross section taken along line A-B-C-O-D in FIG. 6A.
Figure 7:
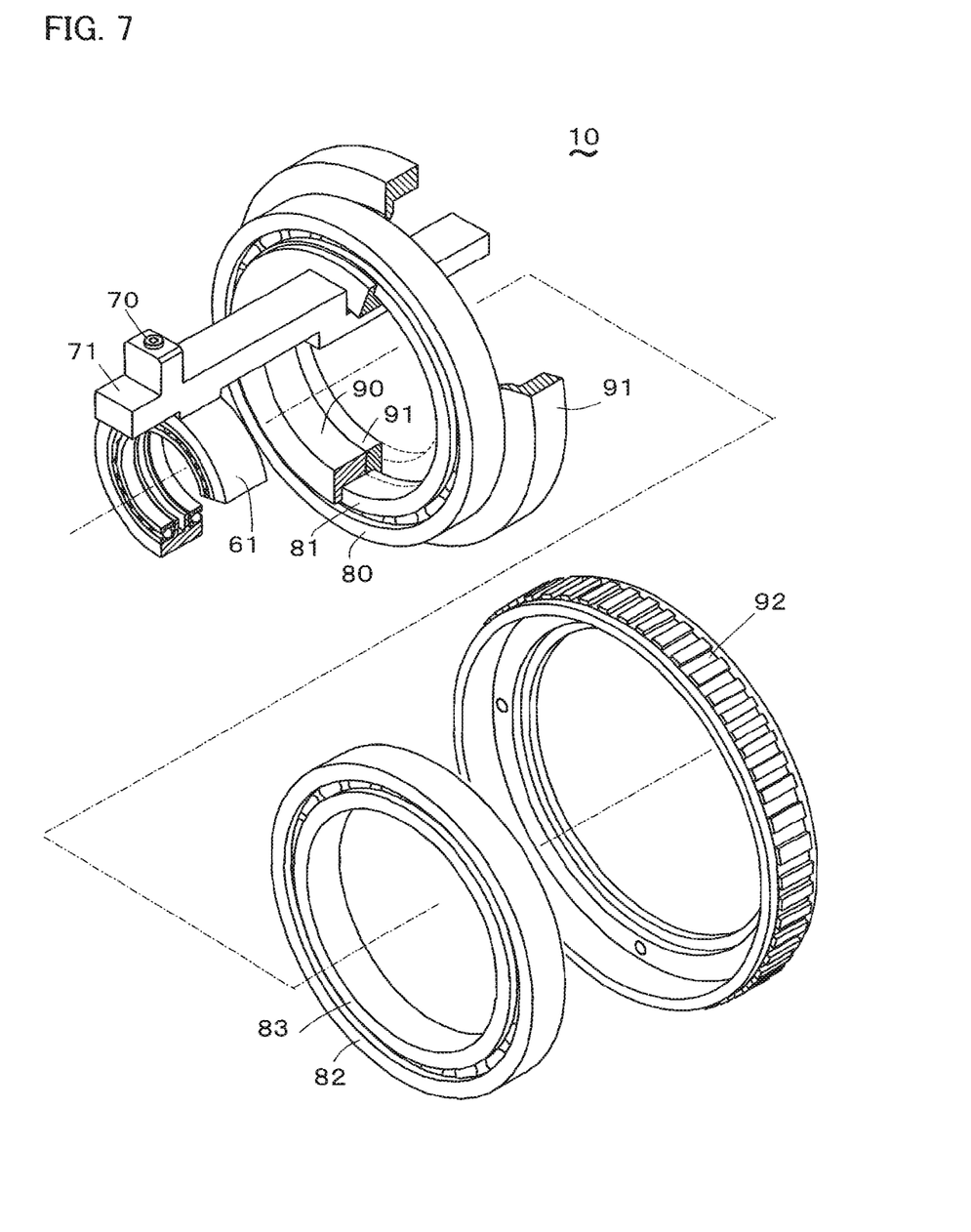
FIG. 7 is an exploded perspective view of a coaxial revolver of the transfer engine.

FIG. 6A shows the three end-effectors 71, 73 and 75 of one of the two transfer engines 6. As shown in FIG. 6B, the transfer engine 6 includes three fixed frames 60a, 60b and 60c, four large-diameter coaxial bearings, a hollow shaft 60 and three small-diameter coaxial bearings 61, 63 and 65. The large-diameter bearings are positioned between the fixed frames 60a and 60c. The inner races of the small-diameter bearings 61, 63 and 65 are fixed to the hollow shaft 60, which is fixed to the fixed frame 60a. The end-effectors 71, 73 and 75 take the form of bars extending eccentrically from and in parallel with the horizontal axis CL. The large-diameter and small-diameter bearings support the end-effectors 71, 73 and 75 in such a manner that the end-effectors can revolve on the horizontal axis CL. These parts form the associated coaxial revolvers 10 (FIGS. 7 and 8A-8C).

Figure 8A:
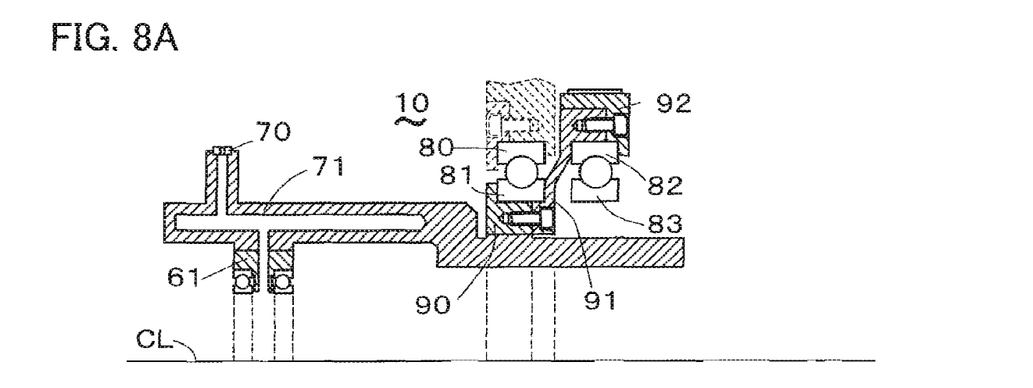
FIGS. 8A, 8B and 8C are axial sections of the three coaxial revolvers of the transfer engine.
Figure 8B:
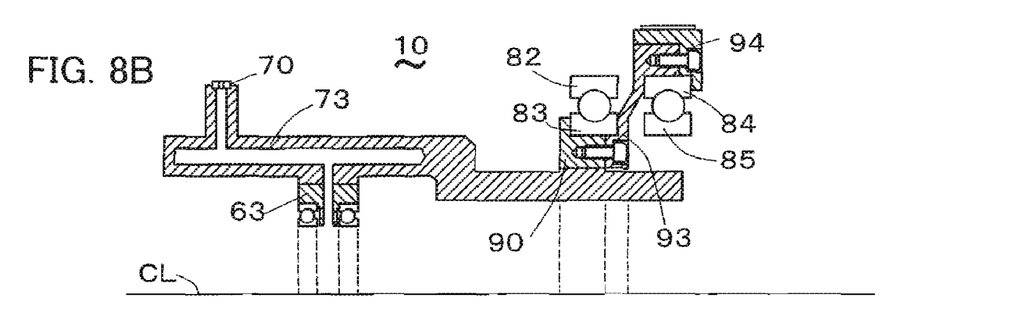
Figure 8C:
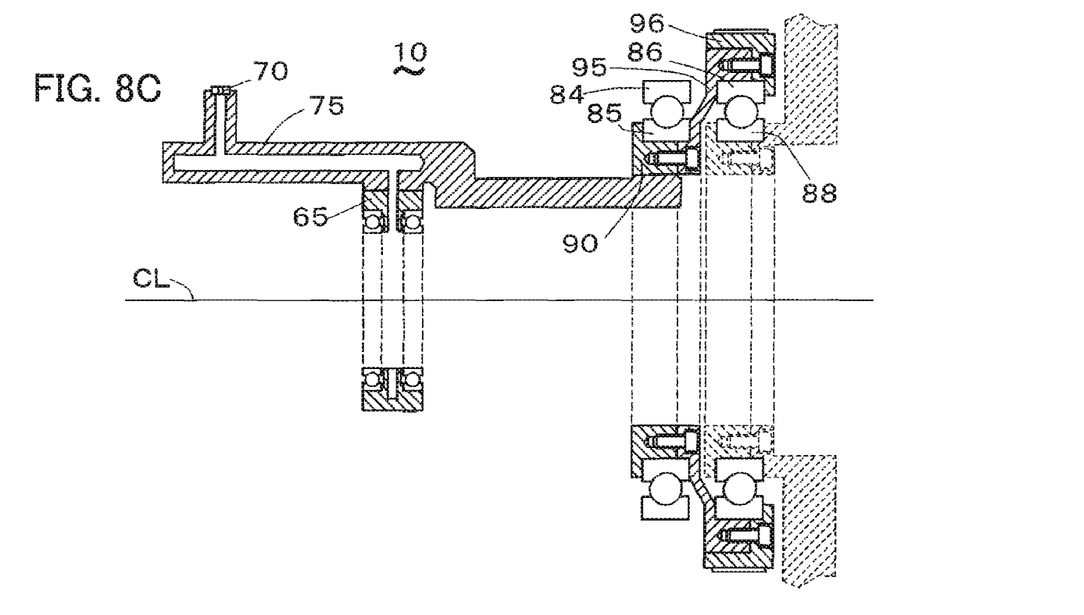
Figure 9:
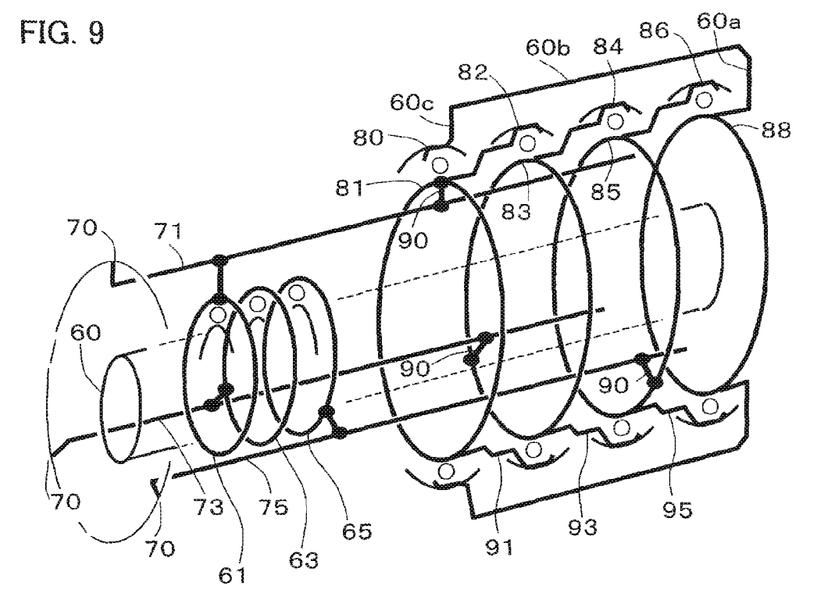
FIG. 9 is a skeleton diagram equivalent to FIG. 6B.
Figure 10:
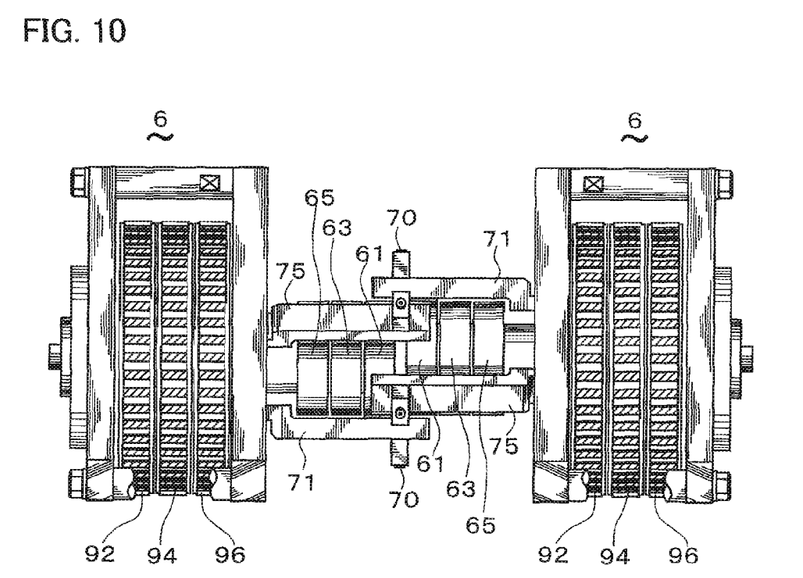
FIG. 10 is a side view of the two transfer engines of the transfer apparatus.

The revolving mechanisms of the coaxial revolvers 10 will be described below. The end-effector 71 is supported at its end portion adjacent to its suction pad 70 by the small-diameter bearing 61 on the hollow shaft 60. The other end portion of the end-effector 71 is fixed to the inner race 81 of the large-diameter bearings by a connector ring 90. The inner race 81 is supported by an outer race 80 of the large-diameter bearing. The outer race 80 is fixed to the fixed frame 60c. The inner race 81 is fixed to the outer race 82 of the axially adjacent large-diameter bearing by an annular connector 91. The outer periphery of the annular connector 91 is surrounded by and fixed to a drive wheel 92, which is also fixed to the outer race 82. The drive wheel 92 has teeth (a precision gear or the like) formed on its outer periphery, which may be driven by a timing belt. The outer race 82 is supported by an inner race 83 of the large diameter bearing (FIGS. 6B and 8B). A circumferentially adjacent another end-effector 73 is fixed to the inner race 83 by a connector ring 90 (FIG. 8B).

The coaxial revolvers 10 including the end-effectors 73 and 75 are constructed similarly to the above-mentioned coaxial revolver 10 including the end-effector 71 (FIGS. 6B, 7 and 8A-8C). Specifically, end-effectors 73 and 75 are fixed to inner races 83 and 85 of the large-diameter bearings by connector rings 90. The inner races 83 and 85 are fixed to outer races 84 and 86 of the axially adjacent large-diameter bearings by the annular connectors 93 and 95 respectively. The outer races 84 and 86 of large-diameter bearings can be rotated by drive wheels 94 and 96. The outer race 86 is supported by an inner race 88. Those races 86, 88 are of the "additional" large-diameter bearing. The inner race 88 is fixed to the fixed frame 60a.

Each of three coaxial revolvers 10 includes one end-effector, one large-diameter bearing, one annular connector, one drive wheel. The annular connector fixes the inner race and the outer race of the axially adjacent two large-diameter bearings each of which is of one of the circumferentially adjacent two end-effectors. The outer race and inner race at both ends of the connected four bearings are fixed to fixed frames. Thus the large-diameter (three plus one additional) four bearings are connected by so-called cascade connection. The transfer engine 6 is structured so that three coaxial revolvers 10 support each other.

Figure 11:
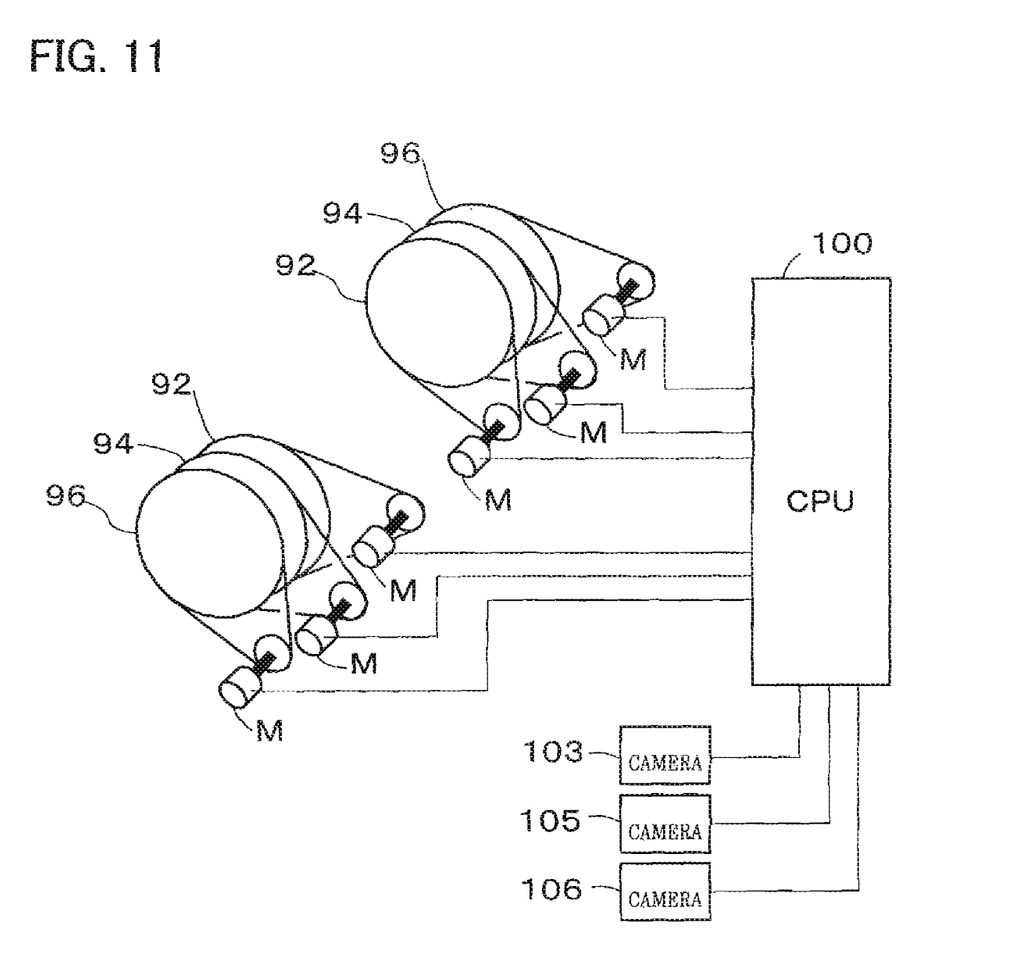
FIG. 11 is a block diagram of the servo drive system of the transfer apparatus.

FIG. 11 shows the servo drive system of the transfer apparatus. This drive system includes a CPU 100 for the servo control of the drive of the coaxial revolvers 10. The CPU 100 makes independent servo control of six motors M, each of which drives one of the coaxial revolvers 10. Because each coaxial revolver 10 revolves independently, each drive wheel 92, 94 or 96 is connected to a general-purpose servo control system motor so that revolving speed/phase change control and position correction control can be made. It is possible to disperse or cancel the external pressure exerted on the revolving axis through the drive wheels 92, 94 and 96, by positioning the three motors M for each drive wheel at different angles around this axis. The outer peripheries of the drive wheels 92, 94 and 96 are surrounded by an open space, where various mechanisms can be fitted. This makes it possible to replace the general-purpose servo control system motors with direct drive mechanisms for more accurate control.

The suction and release of chips by the end-effectors 71-76 will be described below with reference to FIG. 6B. The hollow shaft 60 of each transfer engine 6 has three holes 70a formed through its cylindrical wall and a center hole 70b formed through its end wall adjacent to the frame 60a. Negative pressure for the chip suction is applied through the communicating path made of the holes of the suction pads 70; the spaces in the end-effectors; holes and slits of the small-diameter bearings 61, 63 and 65; and the shaft holes 70a and 70b; by a pneumatic controller (not shown), which is fitted to the transfer apparatus. The small-diameter bearings 61, 83 and 65 are formed with pressure control holes (not shown). While the small-diameter bearings 61, 83 and 65 are rotating with the end-effectors 71-76, the pressure control holes can be connected to a pipe line (not shown) for release so that chips can be released from the suction pads 70.

The present invention is not limited to the preferred embodiment, which may be modified into various forms. For example, a continuous material might be cut into chips, which might then be fed at a constant pitch onto the first carrier 3. In this case, the transfer apparatus might be fitted with means of alignment for pitch-stabilizing correction and position correction. The transfer apparatus might also be fitted with a non-halt phase synchronizer for making the work intervals on the second carrier 5 constant without halting the works being fed. This could make the transfer apparatus more efficient. The transfer apparatus can also be used as a converting machine, a printer, a labeler, a semiconductor producing apparatus or the like for transfer-printing of coating liquid on continuous or separated sheets, and an apparatus for transfer, relocation, lamination or arrangement of small chips or labels.

What is claimed is:

1. A method for controlling an electric parts manufacturing apparatus comprising:

controlling a first carrier to convey a plurality of chips along a first path;

controlling a second carrier to convey a plurality of works along a second path;

receiving a measurement of a first speed of the chip and a second speed of the work from a sensor;

independently revolving each of a plurality of coaxial revolvers, each of which has one of a plurality of end-effectors, each of the coaxial revolvers configured to revolve around one stationary common axis;

controlling a plurality of servo drives, each configured to drive a respective one of the coaxial revolvers independently, to change a periodic revolving speed of the respective coaxial revolver individually based on the measurement of the first and second speeds received from the sensor; and synchronizing each of the plurality of end-effectors affixed to a respective one of the coaxial revolvers to receive the chip from the first carrier and to transfer the chip onto the work conveyed by the second carrier;

wherein each of the end-effectors is affixed to a respective one of said coaxial revolvers and all of the end-effectors are distributed in one stationary common circle around said one stationary common axis, wherein each of said end-effectors revolves independently along the one stationary common circle in sequential order in a periodic motion by the action of the servo drives, wherein the servo drives are configured to change a respective revolving speed of each of the end-effectors independently during the periodic motion;

wherein the independently revolving each of the plurality of coaxial revolvers includes revolving a plurality of coaxial bearings including a first coaxial bearing through a last coaxial bearing, each of the coaxial bearings respectively including an inner race and an outer race, the outer race of the first coaxial bearing being affixed to a first end of a rigid frame and the inner race of the last coaxial bearing being affixed to a second end of the rigid frame disposed opposite the first end along the axial direction, each of said coaxial revolvers including a respective one of the first through a next-to-last one of the coaxial bearings arranged in sequential order in the axial direction, the inner race of each of the first through the next-to-last one of the coaxial bearings being fixed to an outer race of an adjacent coaxial bearing, and each of said end-effectors being connected to a corresponding coaxial revolver proximal to the inner race of the associated bearing, and wherein the independently revolving each of the plurality of coaxial revolvers further includes activating the outer race of the associated bearing by applying a rotational driving force of a corresponding one of said servo drives.

2. The method according to claim 1, wherein the synchronizing each of the end-effectors includes:

controlling one of the servo drives to reduce an angular velocity of one of the end-effectors during a first period prior to receiving the chip from the first carrier;

controlling the servo drive to rotate the end-effector at a constant angular velocity during a second period;

controlling the end-effector to receive the chip from the first carrier when in the second period; and controlling the servo drive to increase the angular velocity of the end-effector during a third period after receiving the chip from the first carrier.

3. The method according to claim 1, further comprising:

controlling a pneumatic system to apply suction when receiving the chip; and controlling the pneumatic system to release the suction when transferring the chip onto the work.

4. The method according to claim 1, wherein the chips are IC chips, and wherein the works are IC card parts or RF tag parts in a form of sheets.

* * * * *